United States Patent
Ahmad

[19]

[11] Patent Number: 6,037,639
[45] Date of Patent: Mar. 14, 2000

[54] FABRICATION OF INTEGRATED DEVICES USING NITROGEN IMPLANTATION

[75] Inventor: Aftab Ahmad, Boise, Id.

[73] Assignee: Micron Technology, Inc., Boise, Id.

[21] Appl. No.: 08/871,210

[22] Filed: Jun. 9, 1997

[51] Int. Cl.[7] .................................................. H01L 29/76
[52] U.S. Cl. .......................................... 257/401; 257/411
[58] Field of Search ................................... 257/410, 401, 257/411

[56] References Cited

U.S. PATENT DOCUMENTS

| | | | |
|---|---|---|---|
| 4,839,301 | 6/1989 | Lee | 437/29 |
| 4,996,081 | 2/1991 | Ellul et al. | 427/96 |
| 5,057,499 | 10/1991 | Lowrey et al. | 437/60 |
| 5,073,509 | 12/1991 | Lee | 437/34 |
| 5,177,027 | 1/1993 | Lowrey et al. | 437/41 |
| 5,240,874 | 8/1993 | Roberts | 437/69 |
| 5,264,724 | 11/1993 | Brown et al. | 257/347 |
| 5,266,510 | 11/1993 | Lee | 437/44 |
| 5,272,367 | 12/1993 | Dennison et al. | 257/306 |
| 5,341,016 | 8/1994 | Prall et al. | 257/412 |
| 5,345,104 | 9/1994 | Prall et al. | 257/607 |
| 5,349,494 | 9/1994 | Ando | 361/322 |
| 5,360,769 | 11/1994 | Thakur et al. | 437/239 |
| 5,376,593 | 12/1994 | Sandhu et al. | 437/242 |
| 5,378,641 | 1/1995 | Cheffings | 437/35 |
| 5,393,683 | 2/1995 | Mathews et al. | 437/42 |
| 5,405,791 | 4/1995 | Ahmad et al. | 437/34 |
| 5,407,870 | 4/1995 | Okada et al. | 437/241 |
| 5,429,972 | 7/1995 | Anjum et al. | 437/47 |
| 5,463,234 | 10/1995 | Toriumi et al. | 257/410 |
| 5,472,896 | 12/1995 | Chen et al. | 437/44 |
| 5,811,865 | 9/1998 | Hodges et al. | 257/411 |

OTHER PUBLICATIONS

Shimizu, et al. "Impact of Surface Proximity Gettering and Nitrided Oxide Side–Wall Spacer by Nitrogen Implantation on Sub–Quarter Micron CMOS LDD FETs", IEDM 95, pp. 859–862 (1995)., Dec. 1995.

*Primary Examiner*—Mark V. Prenty
*Attorney, Agent, or Firm*—Knobbe, Martens, Olson & Bear, LLP

[57] ABSTRACT

A process is provided for forming an isolating nitride film to isolate gate polysilicon of a gate structure. Specifically, the process comprises providing a channel region defined by a source and drain region of a semiconductor substrate having a gate structure comprising an isolating oxide layer positioned on the channel region and the polysilicon layer positioned on the oxide layer. More specifically, the process comprises the steps of forming the nitrogen implanted regions over the semiconductor substrate by implanting nitrogen atoms into those regions and growing spacers from exposed portions of the polysilicon layer. During the spacer growth, the spacer grows vertically as well as laterally extending under the polysilicon edges. Diffusion of nitrogen atoms to the substrate surface forms silicon nitride under the gate edges, which minimizes current leakages into gate polysilicon.

6 Claims, 2 Drawing Sheets

FABRICATION OF INTEGRATED DEVICES USING NITROGEN IMPLANTATION

BACKGROUND OF THE INVENTION

1. Field of the Invention

The present invention generally relates to semiconductor integrated device design and fabrication and, more particularly, to techniques for improving hot carrier resistance in ULSI transistors, such as CMOSFETs in random access memories (RAMs).

2. Description of the Related Art

In the past ten years, the scale of integration of semiconductor devices has increased significantly. More and more devices, such as CMOS type devices, have been positioned on smaller and smaller sized silicon substrates. In this trend toward higher packing density, the channel lengths of insulated gate field effect transistors have been drastically decreased to fabricate the smaller devices needed for these higher scale integration integrated circuits. However, as the devices approach the sub-micron level for CMOS technology, the channel length of the CMOS devices are so small that functional problems result.

In particular, source/drain punchthrough and hot electron susceptibility are the most critical detrimental short channel effects in CMOS device structures. Source/drain punchthrough occurs when the depletion regions of both the source and the drain of a transistor meet in the channel therebetween and create a depleted region extending from the drain region to the source region. Hence, the inverted channel region, which is located under the gate oxide, is lost due to overlapping source and drain regions. This situation eliminates gate control over the transistor and causes significant current leakages, especially when the transistor is in the "off" state. Presently, this effect can be reduced by positioning antipunchthrough implants in the channel regions during the fabrication process, such as Boron for n-channel devices and Phosphorus or Arsenic for p-channel devices, that prevent the depletion regions from meeting.

The other important problem that results from the short channel structures resulting from sub-micron CMOS dimension is hot electron susceptibility which is defined as the injection of high energy electrons into the gate oxide layer and farther into the polysilicon forming the gate of the CMOS structure. This electron injection into the gate oxide is mainly caused by the high electric field occurring at the drain contact of the transistor and severely reduces the threshold voltage of the transistor. In general, hot electron injection can be reduced by oxidizing the gate edge next to the drain region. Thus, oxidation rounds the gate edge and increases the gate oxide thickness at the gate edges. However, in ULSI applications, the oxide is not a good dielectric for the higher electric fields in these applications.

Alternatively, lightly-doped drain (LDD) structures, which are uniquely designed drain structures, are also advantageously used to overcome the hot electron injection problem. Particularly, in an LDD structure, the source/drain regions are formed by implanting two different ions with different doping densities. As a result, a lightly doped drain region, which is adjacent the channel region, separates the channel region from a heavily doped drain region. This lightly doped region significantly reduces the high electric field which causes hot electron injection into the gate oxide. However, ever decreasing device dimensions have brought many constraints to conventional LDD process technologies.

Specifically, in CMOS ULSI applications, a proper LDD drain should provide adequate hot-carrier protection for the device. In fact, there are many approaches in CMOS technology to provide such optimum LDD structures to prevent hot-electron injection into the gate oxide. One important technique is nitrogen implantation into the source/drain regions during the manufacture of NMOSFETs and PMOSFETs prior to the sidewall-spacer ($SiO_2$) formation. After the sidewall $SiO_2$ spacer deposition, the implanted nitrogen atoms are segregated at the interface between the substrate and the sidewall $SiO_2$ by a low temperature heat treatment. This forms a silicon nitride layer under the sidewall $SiO_2$ which can suppress the hot electron injection.

However, this technique limits the nitrogen atom segregation to the area under the $SiO_2$ sidewall. Due to the high electric field strength, the structure cannot suppress the hot carrier injection into the gate oxide, since the nitrogen segregated area only covers the region under the CVD deposited $SiO_2$ sidewall spacer.

Hence, there is a need for processing techniques that are more suited for preventing punchthrough and hot carrier degradation of CMOS FETs in ULSI applications. There is a particular need for processing techniques that are capable of preventing hot carrier injection into the gate of the transistor.

SUMMARY OF THE INVENTION

The aforementioned needs are satisfied by the process of the present invention which comprises a process to improve hot carrier resistance of a transistor gate by isolating the gate polysilicon with a nitride film. A typical transistor structure is a channel region defined by a source and a drain region formed in a semiconductor wafer. A gate structure is then positioned on the wafer above the channel region where the gate structure is comprised of an isolating oxide region positioned on the wafer and a polysilicon layer positioned thereon.

In the preferred embodiment, the process of forming an isolating nitride film to isolate gate polysilicon comprises first doping the wafer with a global nitrogen implantation which results in forming nitrogen doped regions in the source and the drain regions of the wafer. Hence, nitrogen doped regions are formed over the wafer. Subsequently, an oxidation process is carried out to oxidize exposed portions of the gate polysilicon and the source and the drain regions. However, under the oxidation conditions two other important phenomenons occur. These are the formation of a polysilicon bird's beak region and the diffusion of nitrogen atoms into the gate region to form silicon nitride. Specifically, during the oxide growth, the oxide layer can also laterally extend under the polysilicon gate edges and form a wedge shaped oxide profile at the poly gate edges. The diffusion of nitrogen atoms from the nitrogen doped regions into these oxidized gate edges also advantageously forms silicon nitride under the gate edges. As is well known, silicon nitride is an excellent dielectric and hence provides an effective protection against current leakage into the gate polysilicon.

These and other objects and advantages of the present invention will become more fully apparent from the following description taken in conjunction with the accompanying drawings.

DETAILED DESCRIPTION OF THE PREFERRED EMBODIMENT

As will be described hereinbelow, the preferred embodiment of the present invention is directed to improving hot carrier resistance of CMOS LDD FETs in ULSI applications by implanting nitrogen atoms into the source and drain regions, and subsequently reoxidizing gate polysilicon to segregate nitrogen atoms under the polysilicon edges. Reference will now be made to the drawings wherein like numerals refer to like parts throughout.

Figure 1:
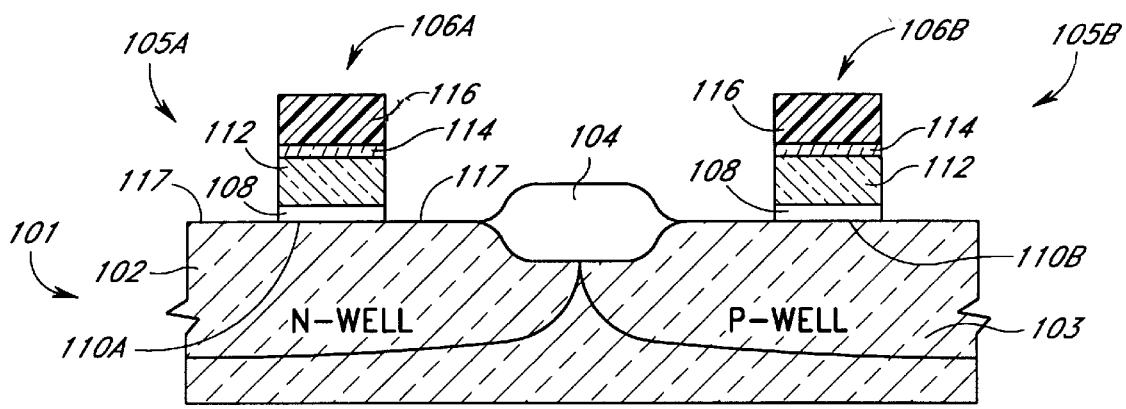
FIG. 1 is a cross-sectional view of a silicon wafer portion having n-channel and p-channel gate stacks on the top surface.

FIG. 1 shows an exemplary CMOS circuit 100 prepared using conventional process steps up to the point of defining an n-channel MOSFET region 105A and a p-channel MOSFET structure 105B on a silicon substrate 101. Hence, a basic CMOS structure having n-well 102 and p-well 103 regions is formed in the silicon substrate 101. As can be seen in FIG. 1, a field oxide region 104 is also formed on the top surface of the substrate 101 at the intersection of the n-well region 102 and the p-well region 103. Further, an n-channel gate stack 106A is formed on the upper surface of the n-well region 102 and a p-channel gate stack 106B is formed on the upper surface of the p-well region 103. Both of the gate stack structures 106A and 106B may, for example, comprise a conductive gate polysilicon 112 deposited over a thin gate silicon oxide 108, an isolating refractory metal silicide or silicon oxide layer 114 deposited on top of the polysilicon 112 layer and finally a silicon nitride upper layer 116 deposited on this refractory layer 114.

LDD regions (not shown in the Figures) can also be formed in the source and drain regions 117 by implanting low/high dose arsenic (for NMOSFETs) and low/high dose phosphorus (for PMOSFETs). After the LDD implantation step, an optional anti-punchthrough halo implantation step of either boron or phosphorus (not shown) may be performed over the source/drain regions 117. It will be appreciated that such LDD formation and halo implantation processes are well known in the art of semiconductor processing and may be integrated in a variety of ways.

Figure 2:
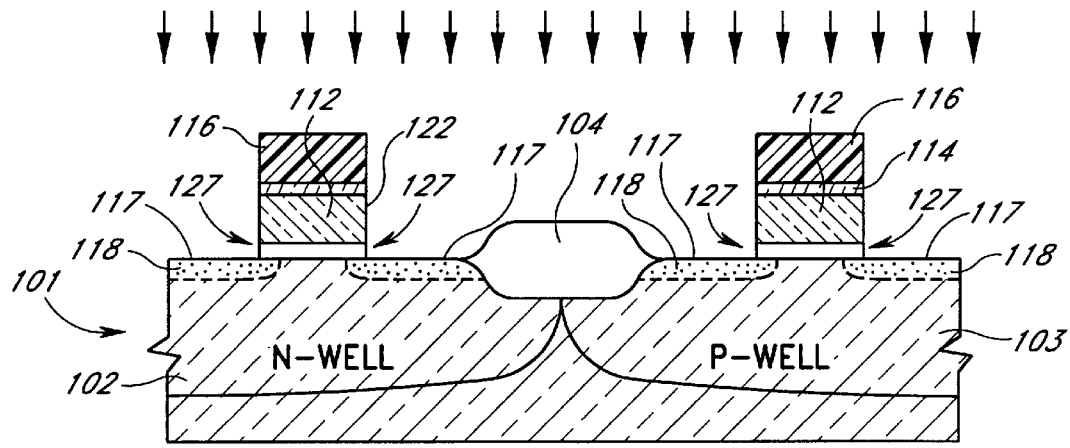
FIG. 2 is a cross-sectional view of the wafer shown in FIG. 1 wherein a global nitrogen implantation is applied on the top surface.

Referring now to FIG. 2, the in-process CMOS circuitry 100 of FIG. 1 is subjected to an ion implantation process with ion dopants selected from a suitable species which can form a preselected silicon-based insulator when reacted with silicon. This ion implantation process forms an ion implanted area 118 in source/drain regions 117 and also in the exposed portions of the substrate 103 (not shown). In the preferred embodiment, the implanted ions are nitrogen ions and the preselected silicon-based insulator is nitride which is formed in the manner explained below. In particular, ion implantation forms a specific concentration and distribution of dopant atoms in the ion implanted areas 118 of the substrate 101. In fact, the implantation process alters the ordered substrate crystal structure and distorts the crystal lattice to accommodate these extra atoms in the implantation area 118.

This type of transformation is called amorphization which is, in this embodiment, caused by nitrogen implant atoms. However, as will be fully understood in the next process step, these amorphous implant areas 118 are advantageously used as a nitrogen atom source during the formation of a nitride insulating layer along the side walls 122 of the gate structures 106A, 106B. Additionally, amorphization of the silicon substrate by implanting nitrogen prevents the out diffusion of LDD implants (As, P, etc.) which reduces the need for the conventional Si or Ge deposition step used to prevent this out diffusion in the prior art.

In the present embodiment, one objective is to provide a dopant nitrogen concentration and distribution that achieves nitrogen atom diffusion into the growing oxide layer. Nitrogen implantation can be accomplished using standard ion implantation. The amount of the nitrogen doping may range from about $1 \times 10^{12}$ atoms to $1 \times 10^{15}$ atoms. A preferred implantation energy is in the range of about 10 keV to 100 keV.

Figure 3:
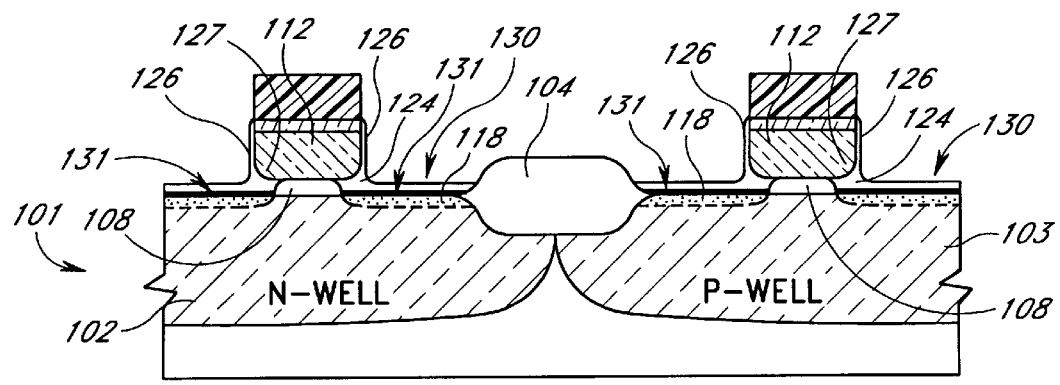
FIG. 3 is a cross-sectional view of the wafer shown in FIG. 2 wherein a layer of silicon dioxide is grown from a gate conductor.

Referring to FIG. 3, following the nitrogen implantation step, a thermal spacer growth step is carried out to form an oxide layer 130 over the source/drain regions 117 and on the sidewall 122 of both n-channel 106A and p-channel 106B transistor gates. This forms a vertical sidewall insulating spacer 126 on the sides of the polysilicon gate 112. This spacer growth step also repairs the implantation damage in the implanted areas 118 and produces a slight bird's beak structure 124 under both the lower edges 127 of each transistor gate poly 112. Due to its shape, this structure 124 is called the "gate bird's beak" or GBB. The GBB 124 increases the thickness of the gate oxide 108 at the lower edges 127 of the gate polysilicon 112 and thereby relieves the electric field intensity at the edges or corners 127 of the gate structure 106. This spacer growth step can be performed using any of the known techniques in the art.

Preferably, the spacer growth comprises a thermal oxidation, such that the spacer 126 comprises oxide. Preferred parameters for the oxidation comprise heating the structure to between about 700° C. and 1,100° C., more preferably between about 850° C. and 950° C., and most preferably about 907° C. The length of the oxidation may range from about 5 minutes to about an hour, more preferably between about 10 minutes and 20 minutes, and most preferably about 15 minutes. A dry oxygen atmosphere is preferred. Alternatively, the spacer growth may comprise a nitridation step.

This spacer growth step is a heating step, like a conventional post-doping thermal drive step. Unlike prior art drive steps, however, oxidation of the substrate causes upward migration and consumption of silicon atoms from the implanted areas 118 (as well as from the gate poly 112), to form the oxide layer 130. This is accompanied by upward motion of implanted nitrogen atoms. The nitrogen concentration difference between the growing oxide layer 130 and the implanted areas 118 provides the driving force for the reaction. Thus, the implanted nitrogen atoms migrate to the growing oxide layer 130 at the substrate surface and a silicon nitride layer 131 is formed over the implanted source/drain regions 11. As well known in the art, silicon nitride has a high dielectric constant, higher in particular than silicon oxide, and is an effective barrier or protective layer against hot carrier injection at the gate edges 127, which is otherwise induced by the high electric field present in a ULSI device.

Significantly, the silicon nitride formation 131 also extends laterally at least partially under the gate poly 112 in the region of the GBB 124, due to mobility of atoms during the oxidation, and to form a nitride edge portion at least partially underlying the gate corner 127. The edge portion 133 may form only the oxide/substrate interface, as illustrated, or nitrogen atoms may diffuse through the growing oxide 130 to the gate poly 112. This laterally grown edge portion 133 effectively isolates the lower polysilicon gate edges 127 from the neighboring source/drain regions and thus effectively minimizes the high electric field induced current leakages into the gate poly 112. As previously mentioned, in prior art applications the conventional oxide spacer deposition and the following heat treatment tend to limit the nitride formation to the region under the deposited sidewall spacer. However, this limited prior art isolation fails to adequately protect the device against hot electron injection.

Figure 4:
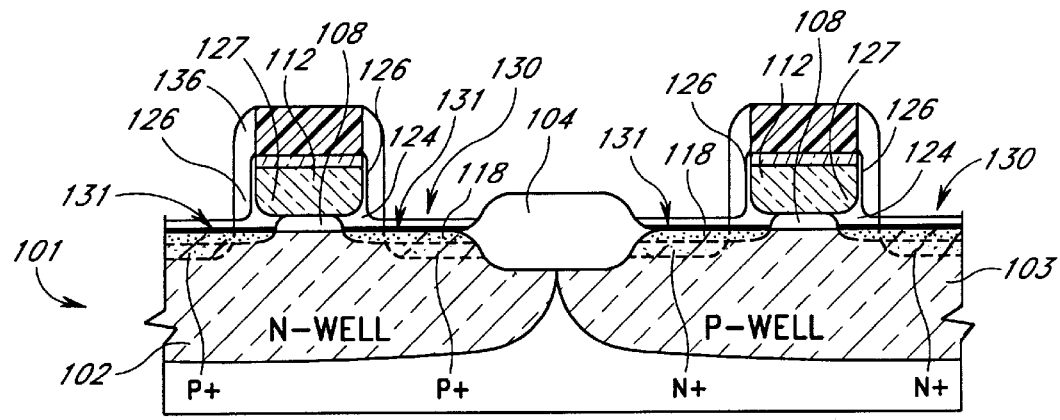
FIG. 4 is a cross-sectional view of the wafer shown in FIG. 3 wherein P+ and N+ regions are formed and a cap layer is deposited over the partially processed wafer.

As illustrated in FIG. 4, polysilicon sidewall oxidation and silicon nitride formation are preferably followed by a formation of a second spacer 136 around sidewalls of each gate structure, prior to masking steps for N+ implantation in the P-well and P+ implantation in the N-well. The spacers 136 may be conventionally formed by blanket deposition of oxide, for example, followed by anisotropic etch of the horizontal surfaces of the oxide, leaving the vertical sidewall spacers 136 shown in FIG. 4.

After the spacers 136 have been formed, conventional source/drain implants may be performed. For the CMOS transistors shown, a masking step protects the N-well while N+ dopants are implanted into the source and drain regions of the P-well. A second masking step protects the P-well while P+ dopants are implanted into the source/drain regions on either side of the gate within the N-well. The spacers 136 serve to protect the channel area underlying the gate from source/drain implants.

Depending upon desired device characteristics, a number of optional doping steps are available to tailor device characteristics. For example, after gate definition, a double-diffuse or "DD" implant of boron may improve short channel characteristics by suppressing punchthrough effect. As an independent option, after forming the source/drain regions through N+/P+ implantation, N+ regions may be doped with a light dose of phosphorus, grading the junction and thereby increasing transistor drive for peripheral NMOSFETs. Similarly, phosphorus-halogen implantation (with the P-wells masked) may improve short channel characteristics of PMOSFETs.

Figure 5:
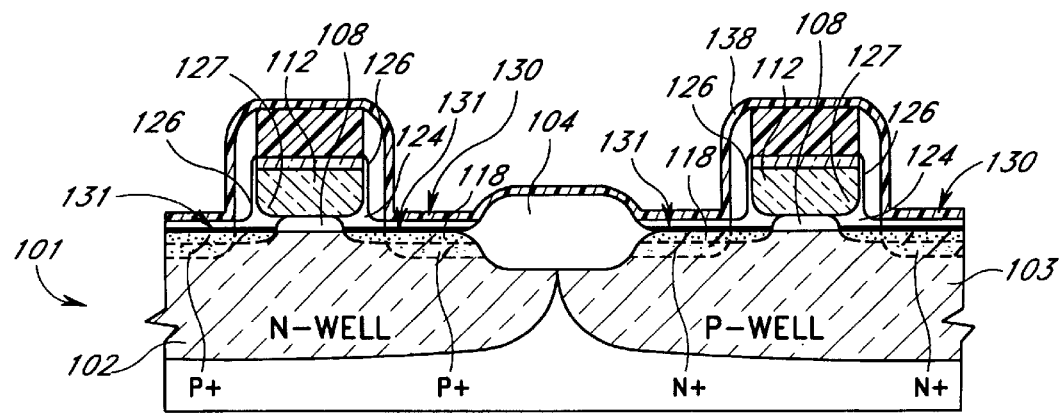
FIG. 5 is a subsequent cross-sectional view.

As illustrated in FIG. 5, the process may thereafter follow conventional processing steps, including a cap layer 138 of silicon nitride or silicon oxide spacer material, CVD-deposited over the structure to block out diffusion from the BPSG to be deposited. Further conventional steps (not shown) include BPSG deposition, reflow, and contact formation.

It will be understood that the improved transistor gate manufacturing technique provided by the preferred embodiment prevents hot electron injection into the gate polysilicon. As explained, the segregation of implanted nitrogen atoms to the growing oxide layer effectively isolates the gate polysilicon edges and minimizes current leakages into the gate polysilicon. Therefore, the improved performance provided by the present embodiment may enable the present invention to be used in the manufacture of deep sub-half-micron size devices and, in particular, high performance memory arrays.

Hence, although the foregoing description of the preferred embodiment of the present invention has shown, described and pointed out the fundamental features of the invention, it will be understood that various omissions, substitutions, and changes in the detail of the apparatus and method as illustrated as well as the uses thereof, may be made by those skilled in the art, without departing from the spirit of the present invention. Consequently, the scope of the present invention should not be limited to the foregoing discussion, but should be defined by the appended claims.

What is claimed is:

1. An integrated circuit, comprising:

a semiconductor substrate;

a gate dielectric extending over a portion of the semiconductor substrate;

a gate electrode overlying the gate dielectric, the gate electrode having a rounded corner adjacent the gate dielectric;

a nitride layer partially underlying the gate dielectric; and a sidewall spacer adjacent the gate electrode and partially overlying the nitride layer.

2. The integrated circuit of claim 1, further comprising an inner oxide spacer grown over the gate electrode sidewall.

3. An integrated circuit, comprising:

a semiconductor substrate;

a gate dielectric extending over a portion of the semiconductor substrate;

a gate electrode overlying the gate dielectric, the gate electrode having a rounded corner adjacent the gate dielectric; and a nitride layer partially underlying the gate dielectric, wherein the nitride layer extends over source and drain regions in the substrate.

4. The integrated circuit of claim 3, further comprising a sidewall spacer adjacent the gate electrode and partially overlying the nitride layer.

5. The integrated circuit of claim 4, wherein the sidewall spacer comprises a deposited silicon oxide.

6. The integrated circuit of claim 1, wherein the nitride layer extends over source and drain regions in the substrate.

* * * * *